United States Patent
Park

(10) Patent No.: US 7,138,849 B2
(45) Date of Patent: Nov. 21, 2006

(54) PHASE MIXER THAT COMPENSATES FOR FREQUENCY VARIATIONS AND PVT VARIATIONS AND A CONTROL METHOD THEREOF

(75) Inventor: Won-Ki Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 88 days.

(21) Appl. No.: 10/910,850

(22) Filed: Aug. 4, 2004

(65) Prior Publication Data

US 2005/0030082 A1 Feb. 10, 2005

(30) Foreign Application Priority Data

Aug. 6, 2003 (KR) ............... 10-2003-0054349

(51) Int. Cl.
*G06G 7/12* (2006.01)
(52) U.S. Cl. ....................... 327/355; 327/359
(58) Field of Classification Search ............. None
See application file for complete search history.

(56) References Cited

U.S. PATENT DOCUMENTS

| | | | | |
|---|---|---|---|---|
| 5,870,670 A | * | 2/1999 | Ripley et al. | 455/304 |
| 6,081,137 A | | 6/2000 | Choi | |
| 6,133,773 A | | 10/2000 | Garlepp et al. | |
| 6,191,638 B1 | * | 2/2001 | Kamase | 327/359 |
| 6,466,071 B1 | * | 10/2002 | Kim et al. | 327/175 |
| 6,509,777 B1 | * | 1/2003 | Razavi et al. | 327/307 |
| 6,637,008 B1 | * | 10/2003 | Higuchi et al. | 716/2 |
| 6,900,681 B1 | * | 5/2005 | Takano | 327/175 |
| 6,919,745 B1 | * | 7/2005 | Lee et al. | 327/149 |
| 2002/0140491 A1 | | 10/2002 | Shim | |
| 2003/0017817 A1 | * | 1/2003 | Cowley | 455/323 |
| 2003/0128059 A1 | | 7/2003 | Saeki | |

FOREIGN PATENT DOCUMENTS

KR   2001-0097770   11/2001

* cited by examiner

*Primary Examiner*—Timothy P. Callahan
*Assistant Examiner*—Cassandra Cox
(74) *Attorney, Agent, or Firm*—F.Chau & Associates, LLC

(57) ABSTRACT

Provided is a phase mixer that compensates for frequency variations and process, voltage, and temperature (PVT) variations, and automatically controls slew rates of input signals according to frequency variations and PVT variations. The phase mixer includes: a mixer, which receives two signals having different phases via input terminals and interpolates the two signals; a frequency detector, which detects frequency variations of an input signal; an integrator, which converts an output signal output from the frequency detector into a DC voltage; and two variable capacitors, which are connected to input terminals of the mixer and have variable capacitances that change in response to the DC voltage. The frequency detector, which is a pulse generator, includes an inversion/delay unit, which inverts and delays the input signal and a NAND gate, which performs a NAND operation on the input signal and a signal output from the inversion/delay unit. Each of the variable capacitors includes a transistor, which has a drain connected to one of the input terminals of the mixer and a gate to which the DC voltage is supplied, and a capacitor, which has a first terminal connected to a source of the transistor and a second terminal connected to a voltage source.

12 Claims, 5 Drawing Sheets f1 < f2

PHASE MIXER THAT COMPENSATES FOR FREQUENCY VARIATIONS AND PVT VARIATIONS AND A CONTROL METHOD THEREOF

BACKGROUND OF THE INVENTION

This application claims priority to Korean Patent Application No. 2003-54349, filed on Aug. 6, 2003, in the Korean Intellectual Property Office, the disclosure of which is incorporated herein in its entirety by reference.

1. Field of the Invention

The present invention relates to a semiconductor integrated circuit, and more particularly, to a phase mixer and a control method thereof.

2. Description of the Related Art

As electronic devices operate at higher speeds, faster central processing units (CPUs), faster memory devices, and faster peripheral devices are needed. Phase locked loop (PLL) circuits or delay locked loop (DLL) circuits are commonly used in semiconductor integrated to generate an internal clock signal in synchronization with an external clock signal.

The PLL or DLL circuit measures a phase difference between the internal clock signal generated by the PLL or DLL circuit and the external clock signal and shifts the phase of the internal clock signal so as to reduce the phase difference. When shifting the phase of the internal clock signal, several reference signals are generated . The two reference signals that most closely coincide with the external clock signal are selected, and an internal clock signal having the same phase as the external clock signal is generated by interpolating the selected reference signals.

During interpolation, a weighted average of the selected reference signals is calculated by weighing each of the selected reference signals by a predetermined percentage in a phase mixer of the PLL circuit or the DLL circuit. The phase mixer is also called a phase blender. A conventional phase mixer is disclosed in U.S. patent application Ser. No. 2002/0140491.

A high quality PLL circuit or DLL circuit has a wide frequency range and can track an external clock signal despite process, voltage, and temperature (PVT) variations. However, when a phase mixer performs interpolation, a shouldering effect (described later) is generated due to frequency variation and PVT variation, and jitter can be generated. To prevent this phenomenon, slew rates of signals input to the phase mixer, that is, the selected reference signals, must be controlled according to frequency variation and PVT variation of the selected reference signals.

FIG. 1 is a graph illustrating a first method by which a conventional phase mixer generates a third signal 103 by interpolating first and second signals 101 and 102 having different phases. FIG. 2 is a graph illustrating a second method by which a conventional phase mixer generates a third signal 203 by interpolating first and second signals 201 and 202 having different phases. In FIGS. 1 and 2, the third signals 103 and 203 are obtained by averaging the first signals 101 and 201 and the second signals 102 and 202 after weighing each of the first signals 101 and 201 and the second signals 102 and 202 by 0.5.

With reference to FIG. 1, when the rise time and the fall time of the first signal 101 and the second signal 102 occupy a relatively large percentage of the respective periods of the first and second signals 101 and 102, frequencies of the first and second signals 101 and 102 are high, and PVT variations are high. An interpolated output signal, that is, the third signal 103, is a signal averaging the first signal 101 and the second signal 102. PVT variations can occur due to a number of factors including bad transistor characteristics, a minimal power source, and high ambient temperature.

With reference to FIG. 2, when the rise time and the fall time of the first signal 201 and the second signal 202 occupy a relatively small percentage of the respective periods of the first and second signals 201 and 202, frequencies of the first and second signals 201 and 202 are low, and the PVT variations are low. During a period when the first signal 201 is at a logic high and the second signal 202 is at a logic low, distortion exists in the interpolated output signal, that is, the third signal 203. This phenomenon is known as the shouldering effect. The PVT variations are small because process parameters make good transistor characteristics, a maximal power source, and low ambient temperature.

Therefore, conventionally, to prevent an interpolation output signal from being distorted, slew rates of input signals of a phase mixer are controlled by connecting a capacitor with a predetermined capacity to an input terminal of the phase mixer for a specific frequency or under a specific PVT condition. However, while such method may be effective for a specific case, it may not work well for a broader range of frequencies or other PVT conditions.

A need therefore exists for a phase mixer that is insensitive to frequency variations and PVT variations, and capable of automatically controlling slew rates of input signals in view of frequency variations and PVT variations.

SUMMARY OF THE INVENTION

According to an aspect of the present invention, there is provided a phase mixer including: a mixer, which receives two signals having different phases via input terminals and interpolates the two signals; a frequency detector, which detects frequency variations of a clock signal; an integrator, which converts an output signal output from the frequency detector into a DC voltage; and variable capacitors, which vary in capacitance load in response to the DC voltage are connected to input terminals of the mixer for slew rate control of the two signals.

It is preferable that the frequency detector, which is a pulse generator, includes an inversion/delay unit, which inverts and delays the input signal and a NAND gate, which performs a NAND operation on the input signal and a signal output from the inversion/delay unit.

It is preferable that each of the variable capacitors includes a transistor, which has a drain connected to one of the input terminals of the mixer and a gate to which the DC voltage is supplied, and a capacitor, which has a first terminal connected to a source of the transistor and a second terminal connected to a voltage source.

According to an aspect of the present invention, there is provided a control method of a phase mixer, which receives two signals having different phases via two input terminals and interpolates the two signals, the method including: connecting a variable capacitor to each of the input terminals of the mixer; detecting frequency variations of an input signal; converting frequency variations into a DC voltage by integrating the detected frequency variations; and changing capacitances of the variable capacitors in response to the DC voltage.

It is preferable that detecting frequency variation includes inverting and delaying the input signal and performing a NAND operation on the input signal and the inverted and delayed signal.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS OF THE INVENTION

The embodiments of the present invention will now be described more fully with reference to the accompanying drawings. Like reference numbers are used to refer to like elements throughout the drawings.

Figure 1:
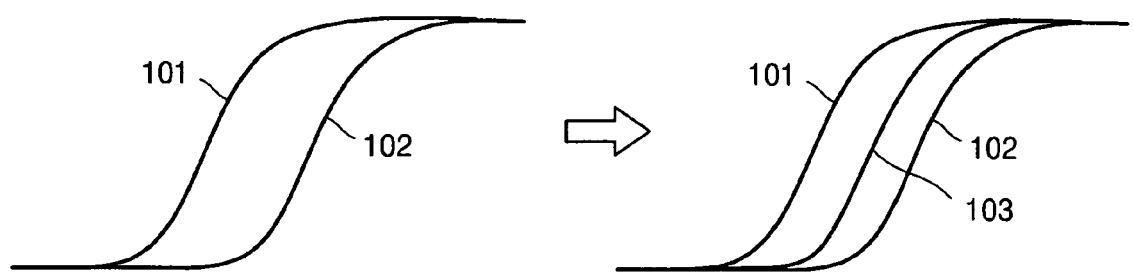
FIG. 1 is a graph illustrating a conventional method wherein a phase mixer generates a third signal by interpolating first and second signals having different phases.
Figure 2:
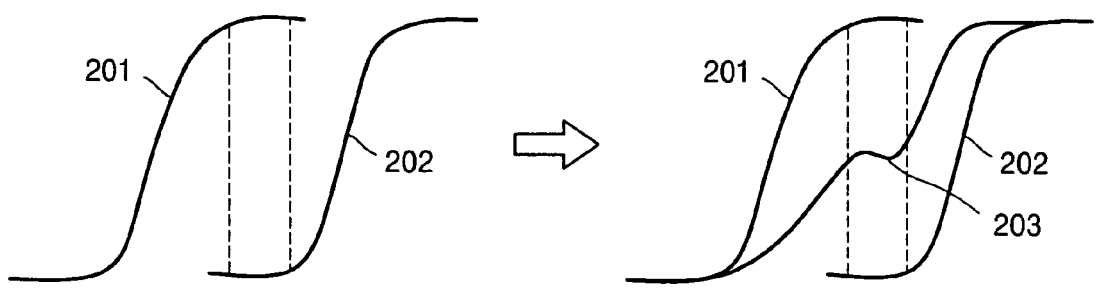
FIG. 2 is a graph illustrating a second conventional method wherein a phase mixer generates a third signal by interpolating first and second signals having different phases.
Figure 3:
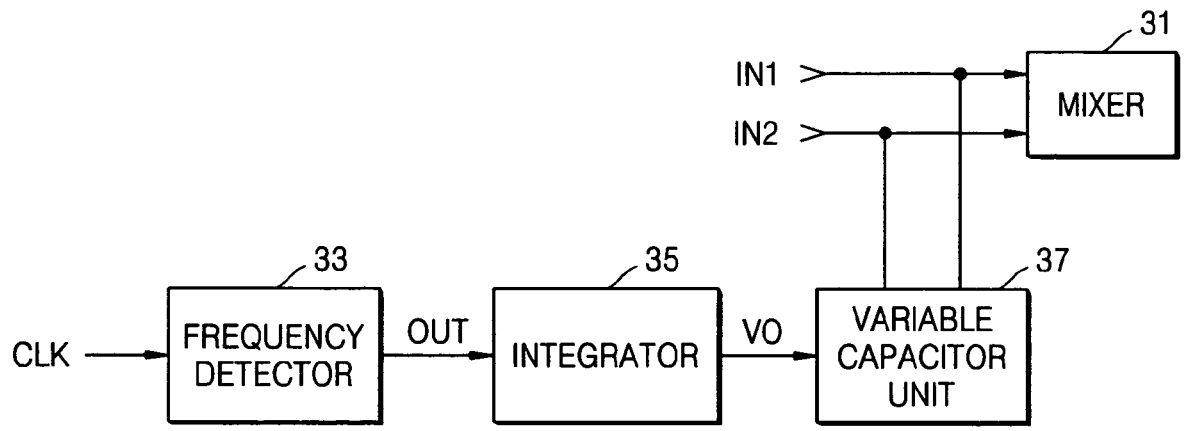
FIG. 3 is a block diagram of a phase mixer according to a first exemplary embodiment of the present invention.

FIG. 3 is a block diagram of a phase mixer according to a first exemplary embodiment of the present invention.

With reference to FIG. 3, the phase mixer includes a mixer 31, a frequency detector 33, an integrator 35, and a variable capacitor unit 37.

The mixer 31 receives two input signals with different phases through first and second input terminals IN1 and IN2, and interpolates the two signals. The frequency detector 33 detects frequency variations of an input clock signal CLK. The integrator 35 converts a signal OUT output from the frequency detector 33 into a constant DC voltage VO. The variable capacitor unit 37 includes two variable capacitors respectively connected to the input terminals of the mixer 31. The variable capacitors are varied in capacitance in response to the DC voltage VO.

Figure 4:
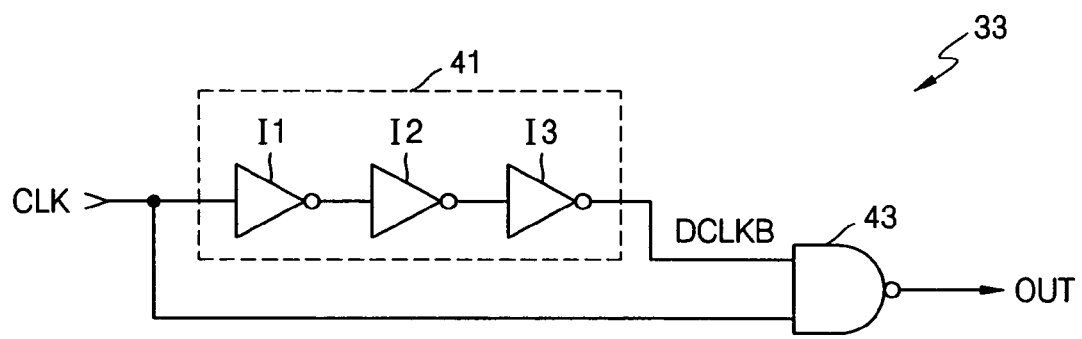
FIG. 4 is a circuit diagram of a frequency detector of FIG. 3.
Figure 5:
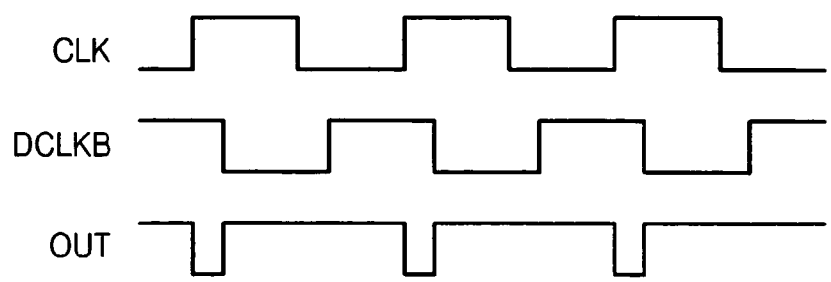
FIG. 5 is a timing diagram showing the signals of the frequency detector of FIG. 4.
Figure 6:
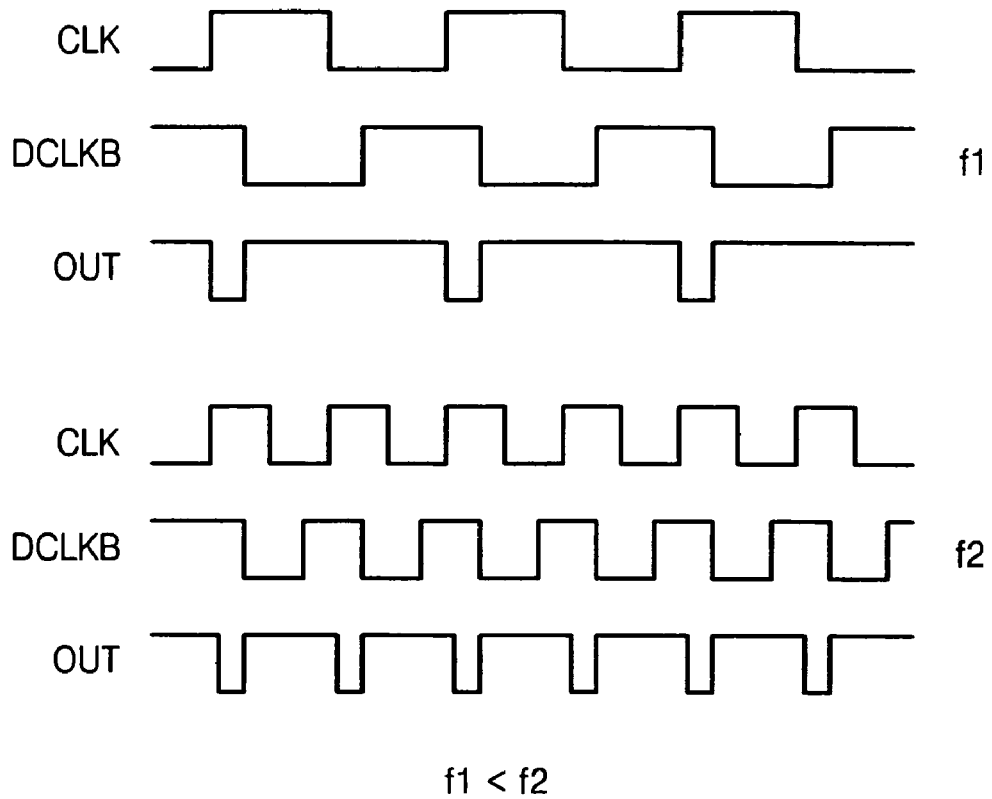
FIG. 6 is a timing diagram of signals of the frequency detector at different frequencies of the input clock signal.

FIG. 4 is a circuit diagram of the frequency detector of FIG. 3. FIG. 5 is a timing diagram of signals in the frequency detector of FIG. 4. FIG. 6 is a timing diagram of signals in the frequency detector with varied frequencies of the input clock signal CLK.

With reference to FIG. 4, the frequency detector 33 is a pulse generator and detects a variation in frequency of an input clock signal CLK supplied by an external device. The frequency detector 33 includes an inversion/delay unit 41, which inverts the input clock signal CLK and delays the input clock signal CLK by a predetermined amount of time. A NAND gate 43 performs a NAND operation on the input clock signal CLK and a signal DCLKB output from the inversion/delay unit 41. The inversion/delay unit 41 includes an odd number of inverters I1–I3 connected in series.

FIG. 5 shows the CLK, DCLKB, and signal OUT output from the NAND gate 43. It can be seen that if the signal DCLKB and the input clock signal CLK are input to the NAND gate 43, an output signal OUT is at a logic low during a predetermined period after a rising edge of the input clock signal CLK is generated.

With reference to FIG. 6, the higher a frequency (f) of the input clock signal CLK, the higher is the occurrence of transitions from a logic high level to a logic low level in the output signal OUT.

Figure 7:
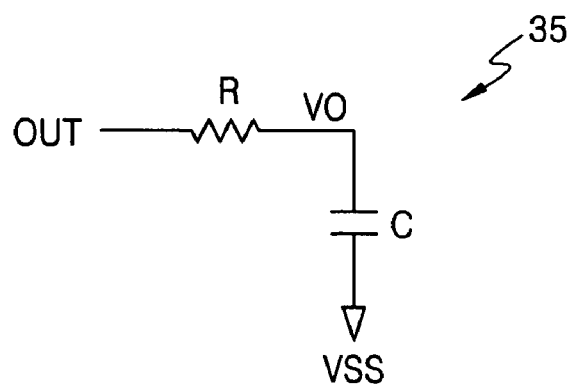
FIG. 7 is a circuit diagram of an integrator of FIG. 3.
Figure 8:
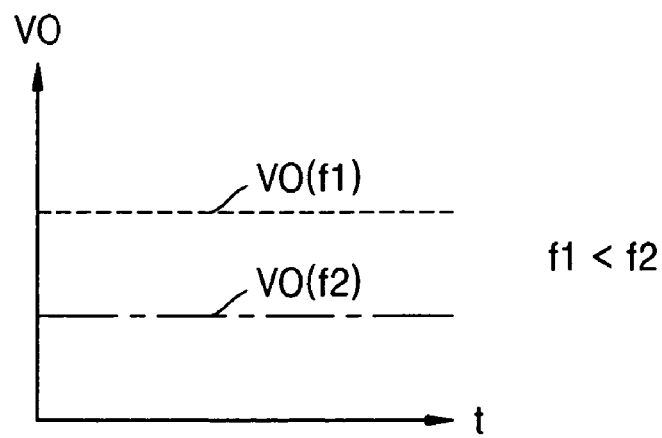
FIG. 8 is a graph illustrating output values of the integrator of FIG. 7.

FIG. 7 is a circuit diagram of the integrator 35 of FIG. 3. FIG. 8 is a graph illustrating output values of the integrator 35 of FIG. 7.

With reference to FIG. 7, the integrator 35 includes a resistor R and a capacitor C and converts the output signal OUT output from the frequency detector 33 into a DC voltage VO. In the first exemplary embodiment, a simple RC integrator is used. However, one skilled in the art can construct the integrator 35 or its equivalent in many ways.

Since the frequency of transition from a logic high level to a logic low level in the output signal OUT increases with the frequency of the input clock signal CLK, an increase in the frequency results in a lower DC voltage VO, as illustrated in FIG. 8.

Figure 9:
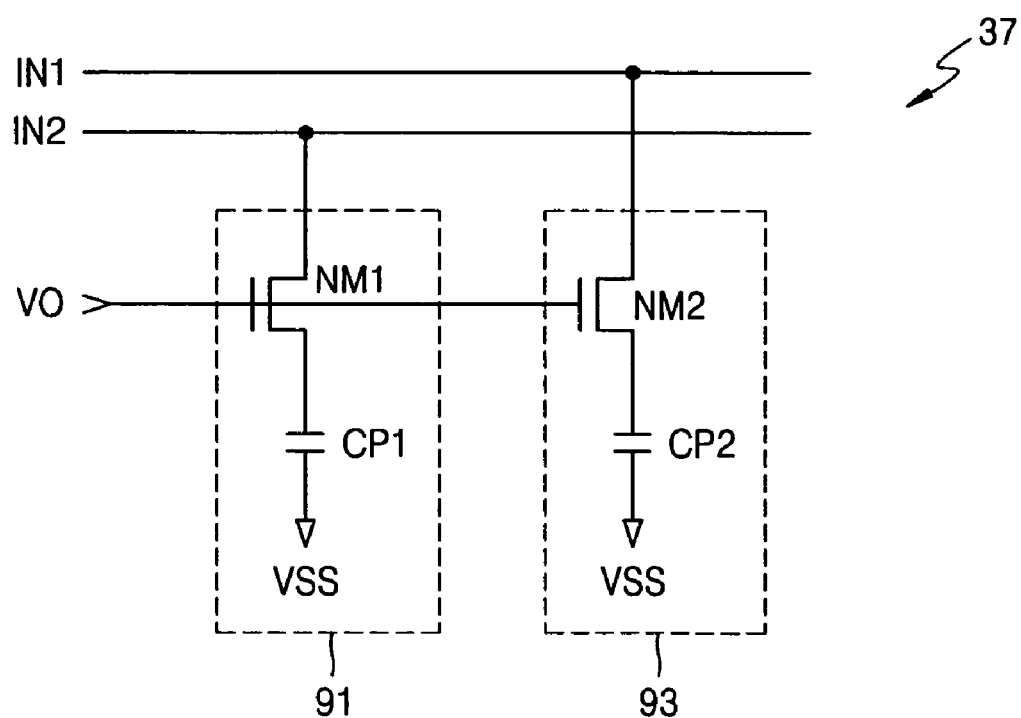
FIG. 9 is a circuit diagram of a variable capacitor unit of FIG. 3.

FIG. 9 is a circuit diagram of the variable capacitor unit 37 of FIG. 3.

With reference to FIG. 9, the variable capacitor unit 37 includes two variable capacitors 91 and 93.

The variable capacitor 91 includes an NMOS transistor NM1, which has a drain connected to the second input terminal IN2 of the mixer 31 of FIG. 3 and a gate to which the DC voltage VO is supplied, and a capacitor CP1, which has one terminal connected to a source of the NMOS transistor NM1 and a second terminal connected to a ground voltage.

The variable capacitor 93 includes an NMOS transistor NM2, which has a drain connected to the first input terminal IN1 of the mixer 31 of FIG. 3 and a gate to which the DC voltage VO is supplied, and a capacitor CP2, which has one terminal connected to a source of the NMOS transistor NM2 and a second terminal connected to the ground voltage.

Since the DC voltage VO is controlled, the NMOS transistors NM1 and NM2 operate like variable resistors. Accordingly, the load capacitance of each of the input terminals IN1 and IN2 of the mixer 31 is variable. If the DC voltage VO is low, the resistance of the NMOS transistors NM1 and NM2 is large, and the load capacitance of each of the input terminals IN1 and IN2 is small. If the DC voltage VO is high, the resistance of the NMOS transistors NM1 and NM2 is small, and the load capacitance of each of the input terminals IN1 and IN2 is large.

Therefore, in the phase mixer according to the first exemplary embodiment of the present invention, the higher the frequency of the input clock signal CLK, the lower the DC voltage VO, and thus, the smaller the load capacitance of the input terminals IN1 and IN2. Accordingly, the slew rate of the signals input via the input terminals IN1 and IN2 of the mixer 31 is small. That is, the slope of each of the signals input via the input terminals IN1 and IN2 is steep.

The lower the frequency of the input clock signal CLK, the higher the DC voltage VO, and thus, the larger the load capacitance of each of the input terminals IN1 and IN2. Accordingly the slew rate of each of the signals input via the input terminals IN1 and IN2 of the mixer 31 is large. That is, the slope of each of the signals input via the input terminals IN1 and IN2 is gradual.

A method of controlling the slew rates of the signals input via the input terminals IN1 and IN2 of the mixer 31 according to PVT variation will now be described.

The frequency detector 33 of FIG. 4 can detect PVT variations. Since the delay of the inversion/delay unit 41 varies according to PVT variations, the pulse width of the output signal OUT varies according to the PVT variations.

Figure 10:
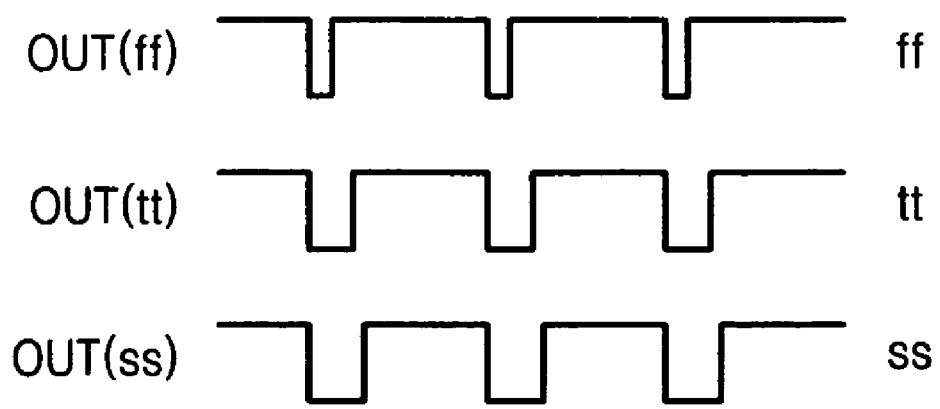
FIG. 10 is a timing diagram illustrating variations of an output signal output from the frequency detector and a graph illustrating variations of an output value of the integrator.
Figure 10:
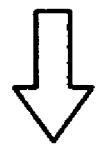
Figure 10:
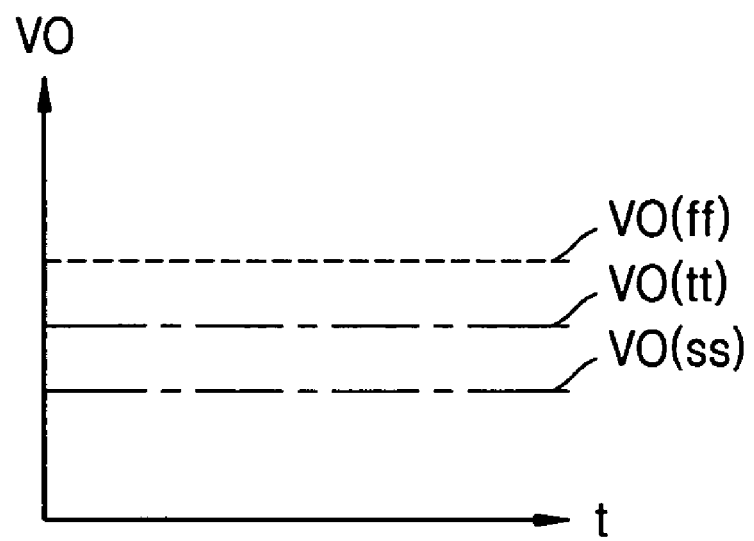

FIG. 10 illustrates the variations of the output signal OUT corresponding to variations of the DC voltage VO of the integrator 35 according to process variations.

Under better conditions, an output signal OUT (ff) is output from the frequency detector 33 and a DC voltage VO (ff) is output from the integrator 35. Under typical conditions, an output signal OUT (tt) is output from the frequency detector 33 and a DC voltage VO (tt) is output from the integrator 35. Under worse conditions, an output signal OUT (ss) is output from the frequency detector 33 and a DC voltage VO (ss) is output from the integrator 35.

Here, the worse condition refers to a condition in which process parameters result in bad transistor characteristics, and the better condition refers to a condition in which process parameters result in good transistor characteristics.

As the conditions deteriorate, a delay of the inversion/delay unit 41 increases. Accordingly, a logic low division of the output signal OUT increases. Therefore, the DC voltage VO is lowest under the worst.

Under the worst condition, since the resistance of the NMOS transistors NM1 and NM2 of the variable capacitor unit 37 is large due to the low DC voltage VO (ss), the load capacitance of each of the input terminals IN1 and IN2 of the mixer 31 is small. Accordingly, the slew rate of each of the signals input via the input terminals IN1 and IN2 of the mixer 31 is smaller. That is, the slopes of the signals input via the input terminals IN1 and IN2 are steep.

Under the best condition, since the resistance of each of the NMOS transistors NM1 and NM2 of the variable capacitor unit 37 is small due to the high DC voltage VO (ff), the load capacitance of each of the input terminals IN1 and IN2 of the mixer 31 is large. Accordingly, the slew rate of each of the signals input via the input terminals IN1 and IN2 of the mixer 31 is larger. That is, the slope of each of the signals input via the input terminals IN1 and IN2 is gradual. As a result of the above, distortion of a signal output from the mixer 31 is reduced. That is, the shouldering effect is reduced.

As described above, in a phase mixer and a control method thereof according to exemplary embodiments of the present invention, slew rates of two input signals of the phase mixer are automatically controlled according to frequency variations and PVT variations of an input clock signal. Therefore, distortion of an output signal of the phase mixer is reduced even when a frequency of an input signal or PVT conditions vary.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase mixer comprising:
    a mixer, which receives two signals having different phases via input terminals and interpolates the two signals;
    a frequency detector, which detects frequency variations of a clock signal;
    an integrator, which converts an output signal output from the frequency detector into a DC voltage; and
    variable capacitors, which vary in capacitance load in response to the DC voltage are connected to input terminals of the mixer for slew rate control of the two signals.

2. The phase mixer of claim 1, wherein the frequency detector generates a pulse generator signal.

3. The phase mixer of claim 2, wherein the frequency detector comprises:
    a delay unit, which delays the clock signal; and
    a gate, which performs a logical operation on the clock signal and the delayed clock signal.

4. The phase mixer of claim 3, wherein the delay unit comprises an odd number of inverters connected in series.

5. The phase mixer of claim 3, wherein the logical operation is a NAND operation.

6. The phase mixer of claim 1, wherein each of the variable capacitors comprises:
    a transistor, which has a gate to which the DC voltage is applied ; and
    a capacitor, which has a first terminal connected to the transistor and a second terminal connected to a voltage node.

7. A control method of a phase mixer comprising:
    connecting a variable capacitor to an input terminal of the mixer;
    detecting frequency variations of a clock signal;
    integrating the frequency variations into an integrated voltage; and
    varying the capacitance load of the variable capacitor in response to the integrated voltage.

8. The method of claim 7, wherein the step of detecting frequency variation comprises:
    delaying the clock signal; and
    performing a logical operation on the clock signal and the delayed clock signal to output a high to low pulse signal upon a low to high transition in the clock signal.

9. The method of claim 8, wherein the step of delaying the clock signal comprises feeding the clock signal through a series of inverters.

10. The method of claim 9, wherein the series of inverters comprises an odd number of inverters.

11. The method of claim 8, wherein the logical operation is a NAND operation.

12. The method of claim 7, wherein the step of varying the capacitor load of the variable capacitors includes connecting the integrated voltage to an input of a load transistor and connecting the load transistor to a capacitor.

* * * * *